(12) United States Patent
Jang et al.

(10) Patent No.: US 9,159,705 B2
(45) Date of Patent: Oct. 13, 2015

(54) SEMICONDUCTOR CHIP CONNECTING SEMICONDUCTOR PACKAGE

(71) Applicant: SAMSUNG ELECTRONICS CO., LTD., Gyeonggi-do (KR)

(72) Inventors: Chul-yong Jang, Gyeonggi-do (KR); Ae-nee Jang, Seoul (KR); Young-lyong Kim, Gyeonggi-do (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 14/303,987

(22) Filed: Jun. 13, 2014

(65) Prior Publication Data
US 2015/0014860 A1    Jan. 15, 2015

(30) Foreign Application Priority Data

Jul. 11, 2013  (KR) .......................... 10-2013-0081786

(51) Int. Cl.
| | |
|---|---|
| *H01L 23/02* | (2006.01) |
| *H01L 23/52* | (2006.01) |
| *H01L 25/11* | (2006.01) |
| *H01L 27/146* | (2006.01) |
| *H01L 25/065* | (2006.01) |

(Continued)

(52) U.S. Cl.
CPC ............ *H01L 25/0657* (2013.01); *H01L 24/03* (2013.01); *H01L 24/05* (2013.01); *H01L 24/24* (2013.01); *H01L 24/82* (2013.01); *H01L 25/50* (2013.01); *H01L 23/3128* (2013.01); *H01L 23/525* (2013.01); *H01L 2224/24145* (2013.01); *H01L 2224/24226* (2013.01); *H01L 2224/32145* (2013.01); *H01L 2224/32225* (2013.01); *H01L 2224/92244* (2013.01); *H01L 2224/94* (2013.01); *H01L 2225/06524* (2013.01); *H01L 2225/06562* (2013.01); *H01L 2225/06565* (2013.01); *H01L 2924/15311* (2013.01)

(58) Field of Classification Search
CPC ..................... H01L 23/5384; H01L 25/0657
USPC ................... 257/686, 777, E25.027, E27.137
See application file for complete search history.

(56) References Cited

U.S. PATENT DOCUMENTS

| | | | | |
|---|---|---|---|---|
| 5,648,684 | A | * | 7/1997 | Bertin et al. .................. 257/685 |
| 5,656,856 | A | * | 8/1997 | Kweon .......................... 257/686 |

(Continued)

FOREIGN PATENT DOCUMENTS

| | | |
|---|---|---|
| JP | 2010056099 | 3/2010 |
| KR | 1020070048952 | 5/2007 |

(Continued)

*Primary Examiner* — Luan C Thai
(74) *Attorney, Agent, or Firm* — F. Chau & Associates, LLC

(57) ABSTRACT

A semiconductor package includes a package substrate including a substrate connection pad. At least one semiconductor chip includes at least one redistribution layer. The at least one redistribution layer covers at least a portion of a chip connection pad and extends along an upper surface of the at least one semiconductor chip in a first direction in which the chip connection pad faces toward an edge of the at least one semiconductor chip. At least one interconnection line disposed on a side of the at least one semiconductor chip electrically connects the substrate connection pad to the at least one redistribution layer. The at least one redistribution layer includes a protruding portion protruding from the edge of the at least one semiconductor chip to contact the at least one interconnection line.

19 Claims, 13 Drawing Sheets

(51) Int. Cl.
*H01L 23/00* (2006.01)
*H01L 25/00* (2006.01)
*H01L 23/31* (2006.01)
*H01L 23/525* (2006.01)

(56) References Cited

U.S. PATENT DOCUMENTS

| | | | |
|---|---|---|---|
| 5,948,533 | A | 9/1999 | Gallagher et al. |
| 6,489,671 | B2 | 12/2002 | Aoki et al. |
| 6,706,971 | B2 * | 3/2004 | Albert et al. ................. 174/255 |
| 7,245,021 | B2 * | 7/2007 | Vindasius et al. ............ 257/777 |
| 7,777,349 | B2 * | 8/2010 | Murayama et al. ........... 257/777 |
| 7,851,922 | B2 * | 12/2010 | Corisis et al. ................. 257/773 |
| 8,058,717 | B2 * | 11/2011 | Takano .......................... 257/686 |
| 8,169,065 | B2 * | 5/2012 | Kohl et al. .................... 257/686 |
| 8,269,327 | B2 | 9/2012 | Leedy |
| 8,357,999 | B2 | 1/2013 | Robinson et al. |
| 8,373,280 | B2 | 2/2013 | Harada et al. |
| 8,383,457 | B2 | 2/2013 | Pagaila et al. |
| 8,389,333 | B2 * | 3/2013 | Camacho ...................... 438/112 |
| 8,723,332 | B2 * | 5/2014 | McElrea et al. ............... 257/777 |
| 2009/0020887 | A1 * | 1/2009 | Mizuno et al. ................ 257/777 |
| 2010/0327436 | A1 | 12/2010 | Moshayedi |
| 2012/0032340 | A1 * | 2/2012 | Choi et al. .................... 257/774 |
| 2012/0196406 | A1 | 8/2012 | Pendse |

FOREIGN PATENT DOCUMENTS

| | | |
|---|---|---|
| KR | 1020080080296 | 9/2008 |
| KR | 1020100069669 | 6/2010 |
| KR | 1020110032522 | 3/2011 |
| KR | 20110103413 | 9/2011 |
| KR | 1020120114890 | 10/2012 |
| KR | 1020120119264 | 10/2012 |
| KR | 1020130010426 | 1/2013 |

* cited by examiner

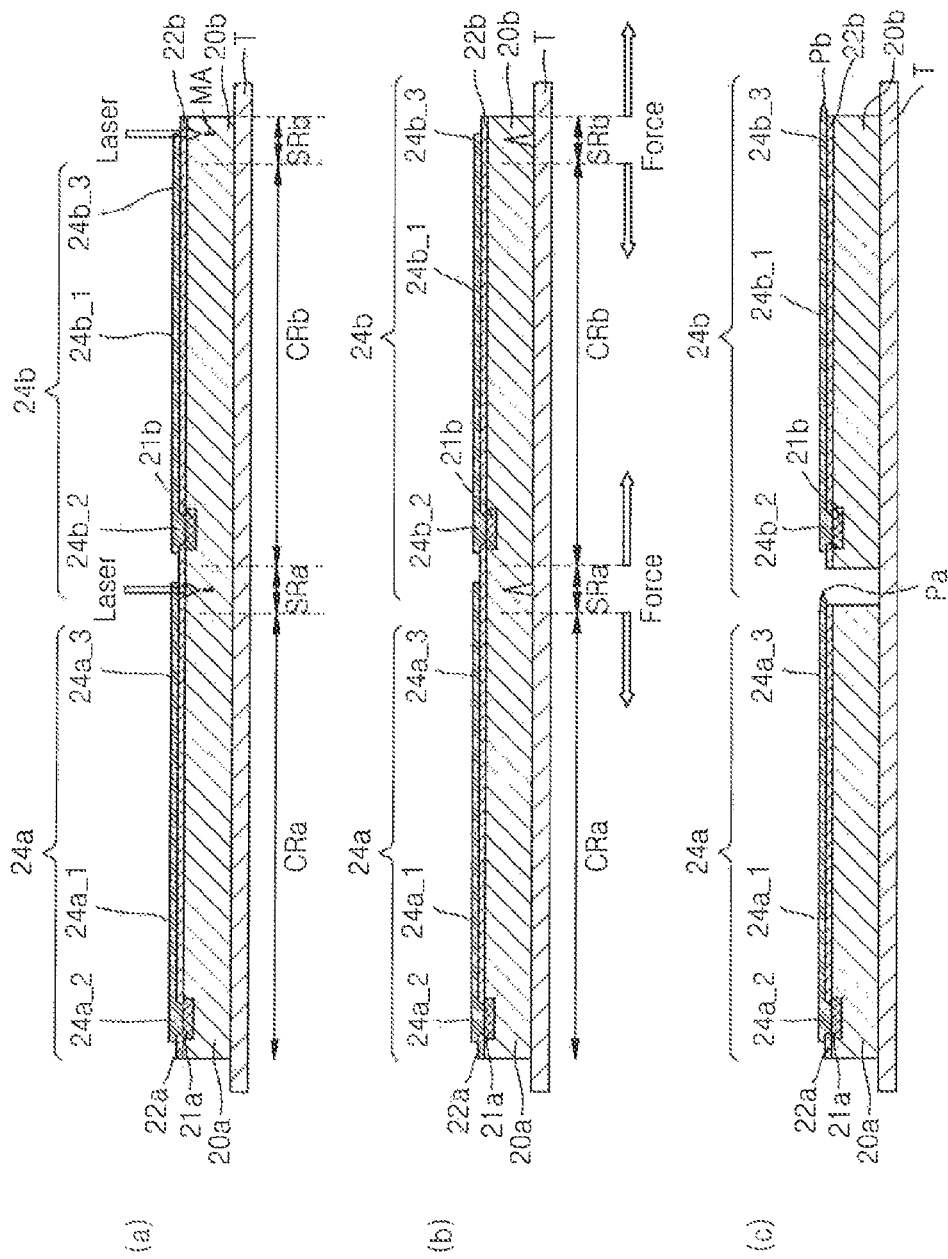

SEMICONDUCTOR CHIP CONNECTING SEMICONDUCTOR PACKAGE

CROSS-REFERENCE TO RELATED APPLICATION

This application claims priority under 35 U.S.C. §119 to Korean Patent Application No. 10-2013-0081786, filed on Jul. 11, 2013, in the Korean Intellectual Property Office, the disclosure of which is incorporated by reference herein in its entirety.

TECHNICAL FIELD

Exemplary embodiments of the present inventive concept relate to a semiconductor package, and more particularly, to a semiconductor package that connects semiconductor chips.

DISCUSSION OF RELATED ART

Products to which semiconductor packages are applied, for example, mobile devices, digital televisions, and the like, may have high performance, be light in weight, and be small in size. Various types of semiconductor chips may be mounted in a single semiconductor package. A plurality of semiconductor chips may be electrically connected to each other and/or to a package substrate by using a wire bonding technology or a through silicon via (TSV) technology. A relatively large space may be needed to form wires, and it may be difficult to make a lightweight and small-sized semiconductor package. For example, when using the TSV technology, manufacturing costs may be increased due to complicated manufacturing processes.

SUMMARY

Exemplary embodiments of the present inventive concept provide a semiconductor package which is light in weight, small in size and for which manufacturing costs may be reduced.

According to exemplary embodiments of the present inventive concept, a semiconductor package includes a package substrate including a substrate connection pad. At least one semiconductor chip including at least one redistribution layer is disposed on the package substrate. The at least one redistribution layer covers at least a portion of a chip connection pad and extends along an upper surface of the at least one semiconductor chip, in a first direction from the chip connection pad to an edge of the at least one semiconductor chip. At least one interconnection line extends along a side of the at least one semiconductor chip and electrically connects the substrate connection pad to the at least one redistribution layer. The at least one redistribution layer includes a protruding portion protruding from the edge of the at least one semiconductor chip. The protruding portion contacts the at least one interconnection line.

An area of a cross section of the protruding portion, which is perpendicular to the first direction, may be changed along the first direction.

As the protruding portion is moved farther away from the edge of the at least one semiconductor chip, a thickness of the protruding portion may gradually decrease.

The protruding portion may be disposed higher than the upper surface of the at least one semiconductor chip.

The semiconductor package may further include an insulating film for covering a side of the at least one semiconductor chip.

The insulating film may cover at least a portion of a lower portion of the protruding portion.

The at least one semiconductor chip may include a reforming area disposed on the edge of the at least one semiconductor chip.

The reforming area may have a crystal orientation that is different from that of an area adjacent to the reforming area in the at least one semiconductor chip.

The semiconductor package may further include a protective layer covering the upper surface of the at least one semiconductor chip and exposing at least the portion of the chip connection pad.

The at least one redistribution layer may include two or more redistribution layers and the at least one interconnection line may include two or more interconnection lines. The two or more redistribution layers may include a first redistribution layer extending from the chip connection pad to a first edge of the at least one semiconductor chip and a second redistribution layer extending from the chip connection pad to a second edge of the at least one semiconductor chip which is different from the first edge. The two or more interconnection lines may include a first interconnection line which is electrically connected to the first redistribution layer, and a second interconnection line which is electrically connected to the second redistribution layer.

The at least one semiconductor chip may include two or more semiconductor chips. The two or more semiconductor chips may be sequentially stacked so that respective protruding portions of redistribution layers of the two or more semiconductor chips face toward a same edge of the package substrate.

The at least one semiconductor chip may include two or more semiconductor chips. The two or more semiconductor chips may be sequentially stacked in the form of stairs so that respective protruding portions of redistribution layers of the two or more semiconductor chips face toward a same edge of the package substrate.

The at least one semiconductor chip may include two or more semiconductor chips. The two or more semiconductor chips may be grouped into semiconductor chips of a first semiconductor chip group, in which the protruding portion of one of the at least one redistribution layer faces toward a first edge of the package substrate, and semiconductor chips of a second semiconductor chip group, in which the protruding portion of another of the at least one redistribution layer faces toward a second edge of the package substrate, and semiconductor chips of the first semiconductor chip group may be alternately stacked with semiconductor chips of the second semiconductor chip group.

The at least one interconnection line may include two or more interconnection lines. The two or more interconnection lines may include a first interconnection line which electrically connects the substrate connection pad to the semiconductor chips of the first semiconductor chip group, and a second interconnection line which electrically connects the substrate connection pad to the semiconductor chips of the second semiconductor chip group. The first interconnection line and the second interconnection line may extend up to different heights based on the package substrate.

According to an exemplary embodiment of the present inventive concept, a semiconductor package includes a package substrate including a substrate connection pad. At least one semiconductor chip is disposed on the package substrate. The at least one semiconductor chip includes a protective layer covering an upper surface of the semiconductor chip and exposing a chip connection pad. An insulating film covers a side of the semiconductor chip. At least one redistribution layer covers at least a portion of the chip connection pad and is disposed along the protective layer in a first direction from the chip connection pad to an edge of the at least one semiconductor chip. At least one interconnection line is disposed along the insulating film and electrically connects the substrate connection pad to the at least one redistribution layer. The at least one redistribution layer includes a protruding portion which protrudes from the edge of the at least one semiconductor chip. The protruding portion contacts the at least one interconnection line, and a portion of the protruding portion is covered by the insulating film.

As the protruding portion protrudes farther away from the edge of the at least one semiconductor chip, a thickness of the protruding portion may gradually decrease.

BRIEF DESCRIPTION OF THE DRAWINGS

The above and other features of the inventive concept will become more apparent by describing in detail exemplary embodiments thereof, with reference to the accompanying drawings in which:

FIGS. 4A through 4F are cross-sectional views illustrating a method of manufacturing a semiconductor package according to an exemplary embodiment of the present inventive concept;

DETAILED DESCRIPTION OF THE EMBODIMENTS

Figure 1:
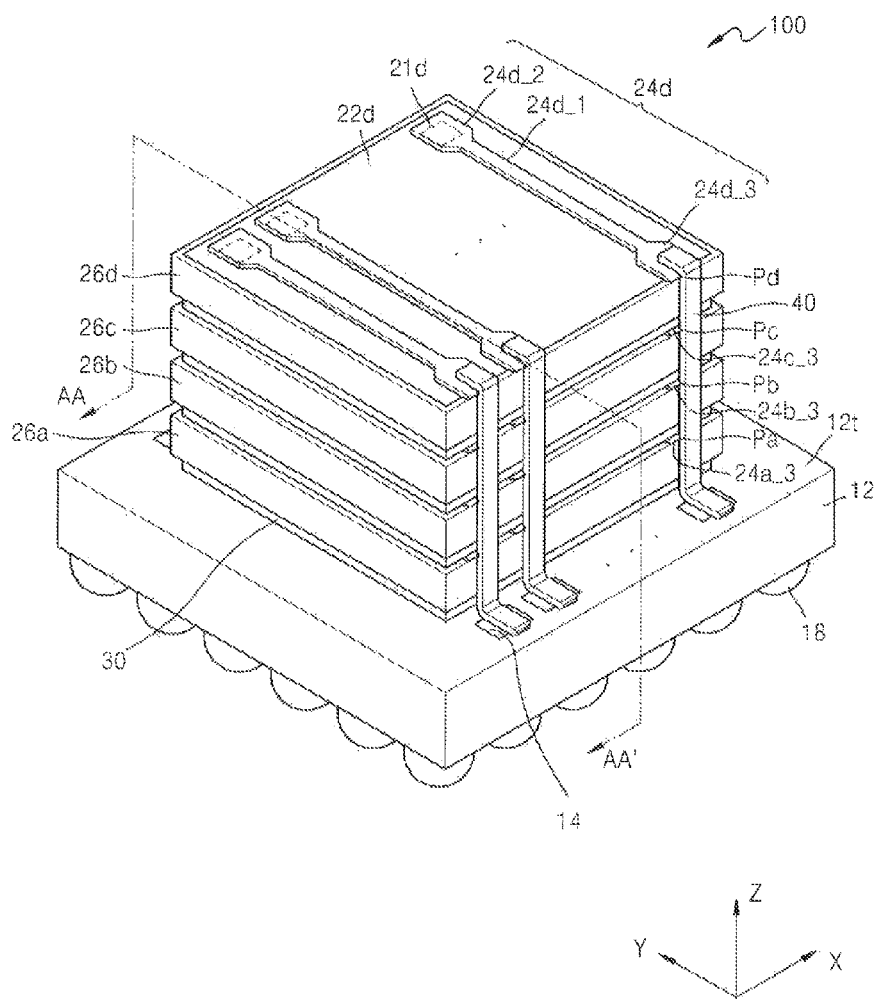
FIG. 1 is a perspective view illustrating a structure of a semiconductor package according to an exemplary embodiment of the present inventive concept.

Hereinafter, exemplary embodiments of the present inventive concept will be described in more detail with reference to the accompanying drawings in which exemplary embodiments are shown. Like reference numerals may denote like elements throughout the drawings and specification, and redundant explanations thereof may be omitted.

It will be understood that, although the terms "first", "second", "third", etc., may be used herein to describe various elements, components, regions, layers and/or sections, these elements, components, regions, layers and/or sections should not be limited by these terms. These terms might not mean a particular sequence or top and bottom, or superior and inferior, and might only used to distinguish one element, component, region, portion, or constituent from another region, portion, or constituent. A first element, component, region, portion, or constituent discussed below may be termed a second element, component, region, portion, or constituent without departing from the teachings of the present inventive concept. For example, without departing from the teachings of the present inventive concept, a first constituent may be termed a second constituent.

Exemplary embodiments may be embodied in a different manner from what is described herein, for example, a particular process sequence may be performed in a different manner from what has been described. For example, when a first process is described and then a second process is described, the first process and the second process may be performed substantially simultaneously, or the second process may be performed and then, the first process may be performed.

Regarding the drawings, the illustrated shape may be deformed according to, for example, a manufacturing technique and/or tolerance. Accordingly, exemplary embodiments of the present inventive concept should not be interpreted as limiting to a particular shape of a region illustrated in the specification, and may include, for example, a change in shape resulting from the manufacturing process.

Figure 2:
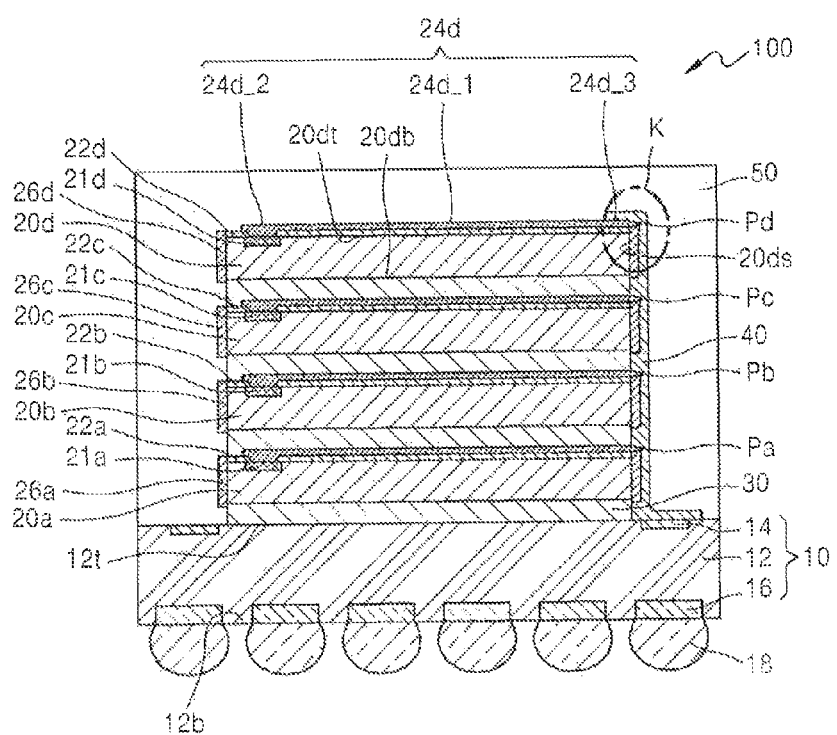
FIG. 2 is a cross-sectional view illustrating a cross section taken along the line AA-AA' of FIG. 1.
Figure 3A:
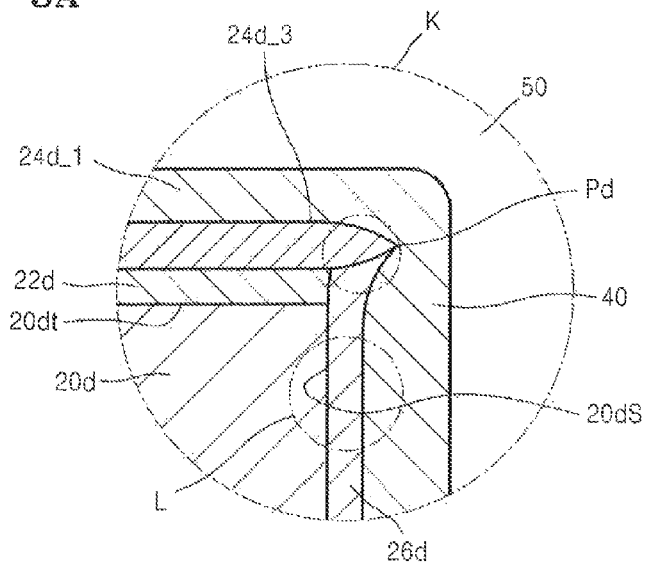
FIG. 3A is a cross-sectional view in which a portion 'K' of FIG. 2 is magnified.
Figure 3B:
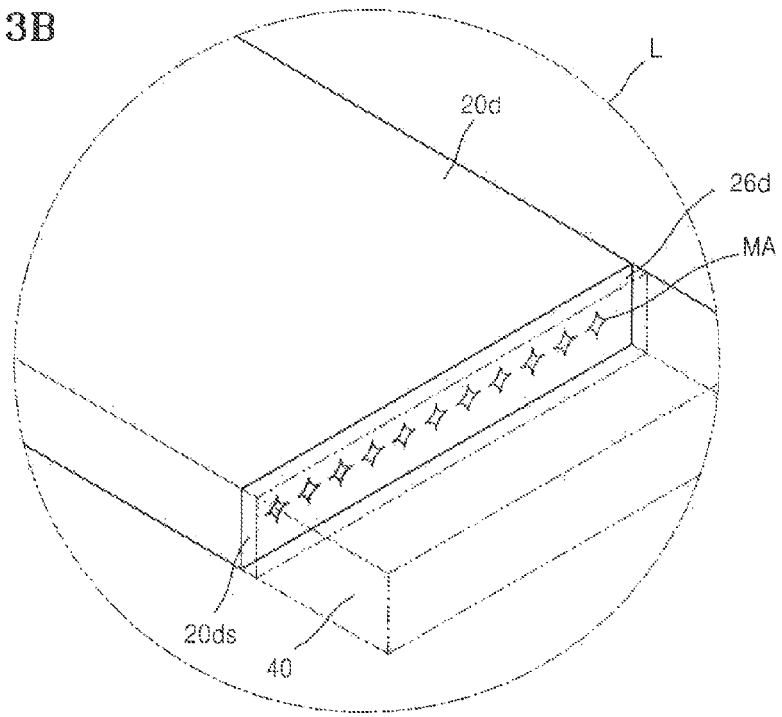
FIG. 3B is a perspective view in which a portion 'L' of FIG. 3A is magnified.

FIG. 1 is a perspective view illustrating a structure of a semiconductor package 100 according to an exemplary embodiment of the present inventive concept, and FIG. 2 is a cross-sectional view illustrating a cross section taken along the line AA-AA' of FIG. 1. FIG. 3A is a cross-sectional view in which a portion 'K'' of FIG. 2 is magnified, and FIG. 3B is a perspective view in which a portion 'L' of FIG. 3A is magnified. For convenience, an encapsulating member (see 50 of FIG. 2) is omitted in FIG. 1.

Referring to FIGS. 1, 2, 3A, and 3B, a package substrate 10 may include a body 12, a plurality of substrate connection pads 14, and a plurality of lower pads 16.

The body 12 of the package substrate 10 may support at least one semiconductor chip, e.g., four semiconductor chips 20a, 20b, 20c, and 20d, which may be sequentially stacked on the body 12 in the positive Z direction. Although in FIGS. 1 and 2, only the four semiconductor chips 20a, 20b, 20c, and 20d are stacked on the package substrate 10, the present inventive concept is not limited thereto, and five or more semiconductor chips may be stacked on the package substrate 10.

The plurality of substrate connection pads 14, which may be spaced apart from the semiconductor chips 20a, 20b, 20c, and 20d by a predetermined distance, may be exposed on an upper surface 12t of the body 12.

The plurality of substrate connection pads 14 may be exposed around two edges of the package substrate 10, e.g., a first edge in the positive Y direction and a second edge in the negative Y direction, which may be opposite to each other with respect to the stacked semiconductor chips 20a, 20b, 20c, and 20d. However, the present inventive concept is not limited thereto, and the plurality of substrate connection pads 14 may be disposed, in various forms. For example, the substrate connection pads 14 may be adjacent to an edge in at least one direction (e.g., the positive X direction, negative X direction, positive Y direction, and/or negative Y direction of the package substrate 10).

The plurality of lower pads 16 on which connecting members 18 are formed may be formed in the lower surface 12b of the body 12.

Although not illustrated in FIGS. 1 and 2, the plurality of substrate connection pads 14 and the plurality of lower pads 16 may be electrically connected to each other via interconnection lines formed inside the body 12, e.g., via penetrating electrodes. A protective layer that defines exposure areas of the substrate connection pads 14 and lower pads 16 and protects the body 12 may be formed on the upper surface 12$t$ and lower surface 12$b$ of the body 12.

The semiconductor chips 20$a$, 20$b$, 20$c$, and 20$d$ may be the same type or different types of semiconductor chips. The semiconductor chips 20$a$, 20$b$, 20$c$, and 20$d$ may have the same structure as each other and may be sequentially stacked on the body 12 of the package substrate 10 via an adhesive member 30. Below, for convenience of explanation, a structure of the uppermost semiconductor chip 20$d$ is described in more detail. Although some reference numerals of redistribution layers of the semiconductor chips 20$a$, 20$b$, and 20$c$ are not illustrated in FIGS. 1 and 2, some reference numerals of redistribution layers of the semiconductor chips 20$a$, 20$b$, and 20$c$ may correspond to those of redistribution layers of the semiconductor chip 20$d$.

The semiconductor chip 20$d$ may have a structure in which a circuit portion thereof is formed in a chip body. The chip body may include a semiconductor material such as IV-group semiconductor material, III-V compound semiconductor material, or an II-VI oxide semiconductor material. In exemplary embodiments of the present inventive concept, the chip body may be a bulk wafer or an epitaxial layer. In exemplary embodiments of the present inventive concept, the chip body may have a silicon-on-insulator (SOI) structure, and may include a buried oxide (BOX) layer. In exemplary embodiments of the present inventive concept, the chip body may include a conductive area, e.g., an area well doped with impurities or a structure doped with impurities.

The circuit portion may be disposed adjacent to the upper surface 20$dt$ of the semiconductor chip 20$d$. Various active semiconductor devices and/or passive semiconductor devices may be formed in the circuit portion. Examples of the active and/or passive semiconductor devices may include a highly integrated circuit semiconductor memory device such as dynamic random access memory (DRAM), static random access memory (SRAM), flash memory, or the like, a central processor unit (CPU), a digital signal processor (DSP), a processor in which a CPU and a DSP are combined with each other, an application specific integrated circuit (ASIC), a micro electro mechanical system (MEMS) device, an optoelectronic device, a display device, etc. A conductive line, a metal interconnection line, a contact plug, a via plug, and/or the like for electrically connecting the active devices and/or the passive devices to each other may be formed in the circuit portion, and an inter layer dielectric (ILD) or an inter metal dielectric (IMD) that is disposed therebetween may be formed in the circuit portion.

A plurality of chip connection pads 21$d$ for providing a power supply and control signals to semiconductor devices formed in the circuit portion of the semiconductor chip 20$d$ may be formed in the semiconductor chip 20$d$. The plurality of chip connection pads 21$d$ may be disposed adjacent to the upper surface 20$dt$ of the semiconductor chip 20$d$. The plurality of chip connection pads 21$d$ may be exposed at the upper surface 20$dt$ of the semiconductor chip 20$d$.

Although the plurality of chip connection pads 21$d$ shown in FIGS. 1 and 2 are disposed adjacent to an edge of the semiconductor chip 20$d$ in the positive Y direction, the present inventive concept is not limited thereto. The plurality of chip connection pads 21$d$ may be disposed adjacent to an edge of the semiconductor chip 20$d$ in at least one direction (e.g., the positive X direction, the negative X direction, and/or the negative Y direction). Although the plurality of chip connection pads 21$d$ in FIGS. 1 and 2 are lined up in the X direction, the present inventive concept is not limited thereto, and the plurality of chip connection pads 21$d$ may be arranged in various forms.

A protective layer 22$d$ may be formed on the upper surface 20$dt$ of the semiconductor chip 20$d$, and may expose at least a portion of each of the chip connection pads 21$d$.

A plurality of redistribution layers 24$d$, each of which covers at least a portion of a corresponding one of the chip connection pads 21$d$ and extends to an edge of the semiconductor chip 20$d$ in the negative Y direction, may be formed on the protective layer 22$d$.

In exemplary embodiments of the present inventive concept, the plurality of redistribution layers 24$d$ may extend to an edge of the semiconductor chip 20$d$ in the positive Y direction. The plurality of redistribution layers 24$d$ may extend to an edge of the semiconductor chip 20$d$, which may be adjacent to the plurality of redistribution layers 24$d$. In exemplary embodiments of the present inventive concept, the plurality of redistribution layers 24$d$ may extend to an edge of the semiconductor chip 20$d$ in the positive X direction or the negative X direction.

Although all of the plurality of redistribution layers 24$d$ in FIGS. 1 and 2 extend to the edge of the semiconductor chip 20$d$, the present inventive concept is not limited thereto. The plurality of redistribution layers 24$d$ may be divided into two groups of redistribution layers which extend to different edges of the semiconductor chip 20$d$. For example, the plurality of redistribution layers 24$d$ may be divided into redistribution layers extending to the edge of the semiconductor chip 20$d$ in the negative Y direction and redistribution layers extending to the edge of the semiconductor chip 20$d$ in the positive Y direction (refer to FIG. 5, for example).

The plurality of redistribution layers 24$d$ may be disposed parallel to each other at a constant pitch. However, the present inventive concept is not limited thereto, and the plurality of redistribution layers 24$d$ may be disposed parallel to each other at various pitches.

Each of the redistribution layers 24$d$ may include an extension portion 24$d\_1$, a connection portion 24$d\_2$, and an expansion pad portion 24$d\_3$. The extension portion 24$d\_1$ may connect the connection portion 24$d\_2$ and the expansion pad portion 24$d\_3$, may have a line shape, and may extend in the Y direction. The connection portion 24$d\_2$ may be connected to a corresponding chip connection pad 21$d$, and may cover at least a portion of the corresponding chip connection pad 21$d$. The expansion pad portion 24$d\_3$ may be connected to an interconnection line 40 at an edge of the semiconductor chip 20$d$.

In exemplary embodiments of the present inventive concept, a width of the connection portion 24$d\_2$ in the X direction and a width of the expansion pad portion 24$d\_3$ in the X direction may be larger than a width of the extension portion 24$d\_1$ in the X direction. The connection portion 24$d\_2$, extension portion 24$d\_1$ and expansion pad portion 24$d\_3$ may connect the corresponding chip connection pad 21$d$ and the interconnection line 40. However, the present inventive concept is not limited thereto. In exemplary embodiments of the present inventive concept, the width of the connection portion 24$d\_2$ in the X direction and the width of the expansion pad portion 24$d\_3$ in the X direction may be equal to that of the extension portion 24$d\_1$ in the X direction.

Although cross section areas of the connection portion 24$d\_2$ and the expansion pad portion 24$d\_3$, which are perpendicular to the Z direction, may have polygonal shapes, the present inventive concept is not limited thereto. The cross section areas of the connection portion 24d4_2 and the expansion pad portion 24d_3, which are perpendicular to the Z direction, may have any desired shape such as, for example, a circle and the like.

The expansion pad portion 24d_3 may include a protruding portion Pd that protrudes from the edge of the semiconductor chip 20d in the negative Y direction. The protruding portion Pd may extend further in the negative Y direction than the edge of the semiconductor chip 20d.

As shown in FIG. 3A, the protruding portion Pd may be disposed higher than the upper surface 20dt of the semiconductor chip 20d. The protruding portion Pd might not be bent from the upper surface 20dt of the semiconductor chip 20d toward the side 20ds. The protruding portion Pd might not contact the side 20ds of the semiconductor chip 20d. At least a portion of the lower part of the protruding portion Pd may be covered by an insulating film 26d. An upper part of the protruding portion Pd might not be covered by the insulating film 26d. The upper part of the protruding portion Pd may contact the interconnection line 40.

The area of a cross section of the protruding portion Pd, which is perpendicular to the negative Y direction, may be changed along the negative Y direction. In exemplary embodiments of the present invention, as the cross section of the protruding portion Pd is moved farther away from the edge of the semiconductor chip 20d in the negative Y direction, the area of the cross section of the protruding portion Pd may gradually decrease. The protruding portion Pd may have a tip shape such that as the protruding portion Pd extends in the negative Y direction, the area of the cross section of the protruding portion Pd gradually decreases.

The side 20ds of the semiconductor chip 20d may be covered by the insulating film 26d. The insulating film 26d may extend along a portion of the protruding portion Pd from the side 20ds of the semiconductor chip 20d. A portion of the protruding portion Pd may be covered by the insulating film 26d, and the other portion of the protruding portion Pd not covered by the insulating film 26d may be exposed.

Reforming areas MA may be formed at an edge of the semiconductor chip 20d. As shown in FIG. 3B, at the edge (e.g., the side 20ds) of the semiconductor chip 20d, the reforming areas MA may be formed in a central portion of the semiconductor chip 20d. The reforming areas MA may be formed by a laser beam focused on a focal point located at a predetermined depth of the semiconductor chip 20d in the negative Z direction by a dicing process using the laser. For example, the reforming areas MA may be areas in which a crystal orientation is different from that of an area adjacent to the reforming areas MA.

Although the reforming areas MA in FIG. 3B are formed in a central portion of the semiconductor chip 20d, the present inventive concept is not limited thereto. The reforming areas MA may be disposed adjacent to the upper surface 20dt or the lower surface 20db of the semiconductor chip 20d. Although the reforming areas MA in FIG. 3B are formed only at an edge (e.g., the edge in the Y direction) of the semiconductor chip 20d, in which the protruding portion Pd is formed, the reforming areas MA may also be formed at another edge of the semiconductor chip 20d, on which a dicing process using a laser is performed.

Like the semiconductor chip 20d, the semiconductor chips 20a, 20b, and 20c may have a structure in which their respective upper surfaces are covered respectively by protective layers 22a, 22b, and 22c, their respective sides are covered respectively by insulating films 26a, 26b, and 26c, and redistribution layers 24a, 24b, and 24c extending to edges of semiconductor chips 20a, 20b and 20c in the negative Y direction are formed respectively on the protective layers 22a, 22b, and 22c.

The semiconductor chips 20a, 20b, 20c, and 20d may be sequentially stacked so that their respective protruding portions Pa, Pb, Pc, and Pd face toward an edge of the package substrate 10 in the negative Y direction. However, the present inventive concept is not limited thereto. The semiconductor chips 20a, 20b, 20c, and 20d may be sequentially stacked so that their respective protruding portions Pa, Pb, Pc, and Pd face toward different edges of the package substrate 10 from one another.

Figure 9:
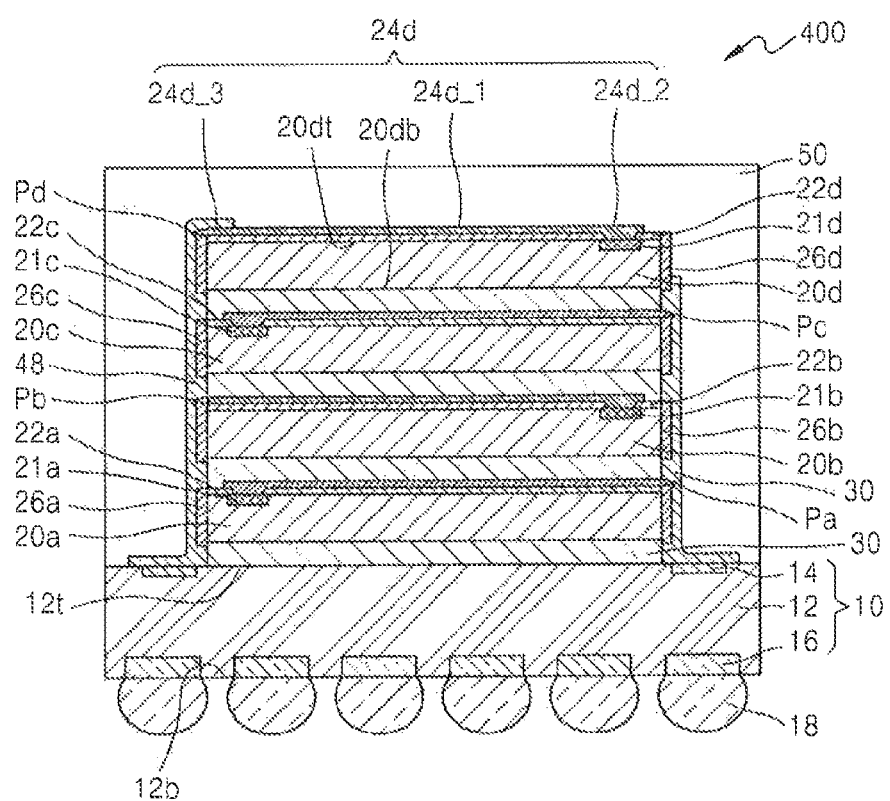
FIG. 9 is a cross-sectional view illustrating a cross section taken along the line CC-CC' of FIG. 8.

In exemplary embodiments of the present invention, the semiconductor chips 20a, 20b, 20c, and 20d may be stacked corresponding to groups, and may be stacked so that the protruding portions Pa, Pb, Pc, and Pd face toward opposite edges of the package substrate 10 based on their respective groups (refer to FIG. 9, for example). In exemplary embodiments of the present invention, the semiconductor chips 20a, 20b, 20c, and 20d may be stacked corresponding to groups, and may be stacked so that the protruding portions Pa, Pb, Pc, and Pd face toward adjacent edges of the package substrate 10 based on their respective groups.

The semiconductor chips 20a, 20b, 20c, and 20d may be stacked so that the protruding portions Pa, Pb, Pc, and Pd are aligned in the Z direction.

A plurality of interconnection lines 40 extending in the positive Z direction may be formed at the sides of the semiconductor chips 20a, 20b, 20c, and 20d. The plurality of interconnection lines 40 may each cover at least a portion of a corresponding substrate connection pad 14 of the package substrate 10. The plurality of interconnection lines 40 may each partially cover the insulating films 26a, 26b, 26c, and 26d on the sides of the semiconductor chips 20a, 20b, 20c, and 20d. The plurality of interconnection lines 40 may each contact a corresponding one of the protruding portions Pa, Pb, Pc, and Pd. The plurality of interconnection lines 40 may each be formed to cover at least a portion of a corresponding expansion pad portion 24d_3 of the redistribution layers 24d formed on the upper surface 20dt of the uppermost semiconductor chip, e.g., the semiconductor chip 20d. When the interconnection lines 40 contact the redistribution layers 24a, 24b, 24c, and 24d and are electrically connected to the redistribution layers 24a, 24b, 24c, and 24d, an electrical connection between the chip connection pads 21a, 21b, 21c, and 21d of the semiconductor chips 20a, 20b, 20c, and 20d and the substrate connection pads 14 corresponding thereto may be formed.

The interconnection lines 40 may be formed in a line shape on the sides of the semiconductor chips 20a, 20b, 20c, and 20d, and may each have a width in the X direction which allows sufficient contact with the protruding portions Pa, Pb, Pc, and Pd. The interconnection lines 40 may be disposed to correspond to the redistribution layers 24d. For example, as illustrated in FIG. 1, the interconnection lines 40 may be disposed parallel to each other at regular intervals and may correspond to the redistribution layers 24d disposed parallel to each other at a uniform pitch.

The semiconductor chips 20a, 20b, 20c, and 20d stacked on the package substrate 10 may be sealed by the encapsulating member 50.

The semiconductor package 100 according to an exemplary embodiment of the present inventive concept might not use wires and may use the redistribution layers 24a, 24b, 24c and 24d and the interconnection lines 40 to electrically connect the semiconductor chips 20a, 20b, 20c, and 20d to each other and/or to electrically connect the semiconductor chips 20a, 20b, 20c, and 20d to the package substrate 10.

When using wires, due to the height of a wire that is formed between an uppermost semiconductor chip and a package substrate, there may be a limit to a reduction in the thickness of a semiconductor package in the Z direction. A bonding defect on substrate connection pads during a wiring process may be prevented by a desired space secured in the X direction or the Y direction on the package substrate. When using wires, it may be difficult to make a semiconductor package that is light in weight and small in size.

The semiconductor package 100 according to an exemplary embodiment of the present inventive concept may minimize the thickness of the semiconductor package 100 in the Z direction and the width of the semiconductor package 100 in the X direction or the Y direction by using the redistribution layers 24d and the interconnection lines 40 without wires. The semiconductor package 100 may be light in weight and small in size.

The interconnection lines 40 extending along the sides of the semiconductor chips 20a, 20b, 20c, and 20d may reduce interconnection lengths thereof and increase space utilization, compared to wires that are formed to be spaced apart from semiconductor chips. When using the interconnection lines 40, electrical characteristics of the semiconductor package 100 may be increased and wiring freedom may be increased.

The semiconductor package 100 might not include a structure in which, for example, a penetration electrode penetrating the semiconductor chips 20a, 20b, 20c, and 20d and a solder joint between the semiconductor chips 20a, 20b, 20c, and 20d may be used to electrically connect the semiconductor chips 20a, 20b, 20c, and 20d to each other and/or to electrically connect the semiconductor chips 20a, 20b, 20c, and 20d to the package substrate 10.

When stacking the semiconductor chips 20a, 20b, 20c, and 20d, the thickness of the semiconductor package 100 in the Z direction may be reduced, and a manufacturing process for forming a penetration electrode might not be needed. A manufacturing cost of the semiconductor package 100 may be reduced, and the productivity of the semiconductor package 100 may be increased.

FIGS. 4A through 4F are cross-sectional views illustrating a method of manufacturing a semiconductor package, according to an exemplary embodiment of the present inventive concept. FIGS. 4A through 4F illustrate an exemplary method of manufacturing the semiconductor package 100 illustrated, for example, in FIGS. 1 and 2.

In FIGS. 4A through 4F, a portion taken along the line AA-AA' of FIG. 1 is illustrated. Like reference numerals may denote like elements throughout the drawings.

In FIGS. 4A through 4F, reference numerals that are the same as those of FIGS. 1 and 2 may denote like elements, and repeated descriptions may be omitted for simplification of description. Since the semiconductor chips 20a, 20b, 20c, and 20d of FIGS. 1 and 2 may be manufactured via the same process, only some of the semiconductor chips 20a, 20b, 20c, and 20d are described with reference to FIGS. 4A through 4C.

Figure 4A:
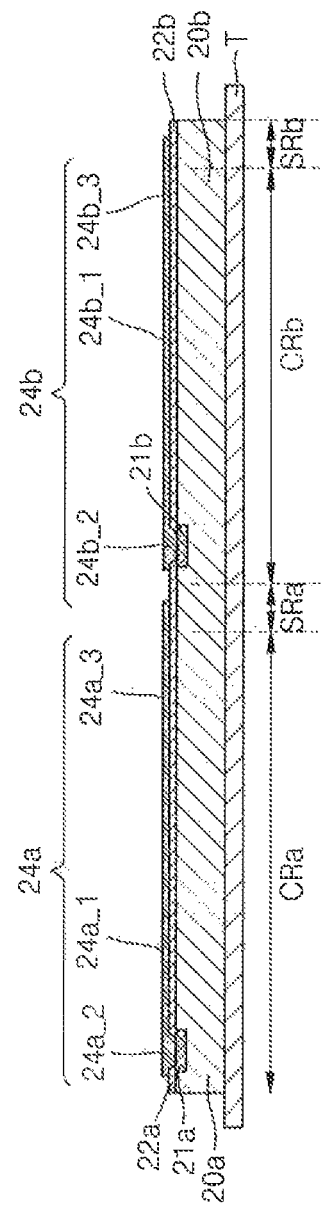

Referring to FIG. 4A, a base substrate in which chip areas CRa and CRb for forming the semiconductor chips 20a and 20b and scribe lane areas SRa and SRb are defined may be prepared. A circuit portion (not shown) including various semiconductor devices, insulating layers such as an ILD layer and/or an IMD layer, and interconnection lines may be formed in the chip areas CRa and CRb of the base substrate.

In the chip areas CRa and CRb, the chip connection pads 21a and 21b that are exposed on the upper surface of the base substrate may be formed. The chip connection pads 21a and 21b may include a conductive material, e.g., a metal material.

In the chip areas CRa and CRb and the scribe lane areas SRa and SRb, the protective layers 22a and 22b covering the upper surface of the base substrate may be formed and the chip connection pads 21a and 21b may be exposed by patterning the protective layers 22a and 22b.

The protective layers 22a and 22b may include an insulating material. In exemplary embodiments of the present inventive concept, each of the protective layers 22a and 22b may have a multi-layer structure including a first protective layer and a second protective layer. The first protective layer may include nitride. The second protective layer may include a polymer. The second protective layer may include an elastic member that may soften an external impact.

The redistribution layers 24a and 24b that may cover at least portions of the chip connection pads 21a and 21b and may extend along the protective layers 22a and 22b may be formed on the protective layers 22a and 22b, respectively. The redistribution layers 24a and 24b may include a conductive material, e.g., aluminum (Al), copper (Cu), gold (Au), silver (Ag), or the like.

The redistribution layers 24a and 24b may be formed by a photolithography process using a photomask. In exemplary embodiments of the present inventive concept, the redistribution layers 24a and 24b may be formed by soft lithography without using photolithography. For example, the redistribution layers 24a and 24b may be formed by a printing method using a paste including Ag, nickel, Cu, or ink. Redistribution layers 24a and 24b may be formed by a roll offset printing method.

A connection portion 24a_2 of the redistribution layer 24a may be formed to cover at least a portion of the chip connection pad 21a. An expansion pad portion 24a_3 of the redistribution layer 24a may be formed to extend from the chip area CRa to the scribe lane area SRa. An extension portion 24a1 of the redistribution layer 24a may be formed to connect the connection portion 24a_2 and the expansion pad portion 24a_3. The redistribution layer 24b may be substantially the same as the redistribution layer 24a.

When a natural oxide is formed on the chip connection pads 21a and 21b and a defective connection with the redistribution layers 24a and 24b is formed, a process for removing the natural oxide may be performed before forming the redistribution layers 24a and 24b.

Referring to FIG. 4B, the semiconductor chips 20a and 20b may be formed by cutting the base substrate along the scribe lane areas SRa and SRb.

As illustrated in FIG. 4B(a), the base substrate may be attached to an elastic tape T and the reforming areas MA may be formed in the base substrate by focusing a laser beam on a focal point located at a predetermined depth of the base substrate in the scribe lane areas SRa and SRb. The reforming areas MA are areas of which a crystal orientation may be different from those of the other areas in the base substrate.

As illustrated in FIG. 4B(b), a predetermined force may be applied to the tape T and a tensile stress may be applied to the base substrate in the reforming areas MA in the scribe lane areas SRa and SRb.

Cracks may be expanded toward the reforming areas MA along lines on which the laser beam has been irradiated in the base substrate, and the base substrate may be divided into the semiconductor chip 20a and the semiconductor chip 20b, as illustrated in FIG. 4B(c), for example.

The reforming areas MA may remain at the sides of the semiconductor chips 20a and 20b. The protruding portion Pa may be formed in the expansion pad portion 24a_3 of the redistribution layer 24a, and the protruding portion Pb may be formed in the expansion pad portion 24b_3 of the redistribution layer 24b. The expansion pad portions 24a_3 and 24b_3 may be formed from the chip areas CRa and CRb to the scribe lane areas SRa and SRb, respectively. Elastic deformation and plastic deformation may occur in the areas of the expansion pad portions 24a_3 and 24b_3 corresponding to boundary areas between the chip areas CRa and CRb and the scribe lane areas SRa and SRb while a tensile stress is applied to the expansion pad portions 24a_3 and 24b_3, and a fracture in the base may substrate occur. The protruding portions Pa and Pb may each have a shape (e.g., a tip shape) in which the area of respective cross-sections thereof perpendicular to the extending direction is gradually decreased.

A defect due to the separation of the redistribution layers 24a and 24b from the upper surfaces of the semiconductor chips may be prevented by dicing the base substrate as described in exemplary embodiments of the present inventive concept. Dicing may be performed quickly and an additional treatment for cleaning might not be needed. Productivity may be increased and manufacturing costs may be reduced.

Figure 4C:
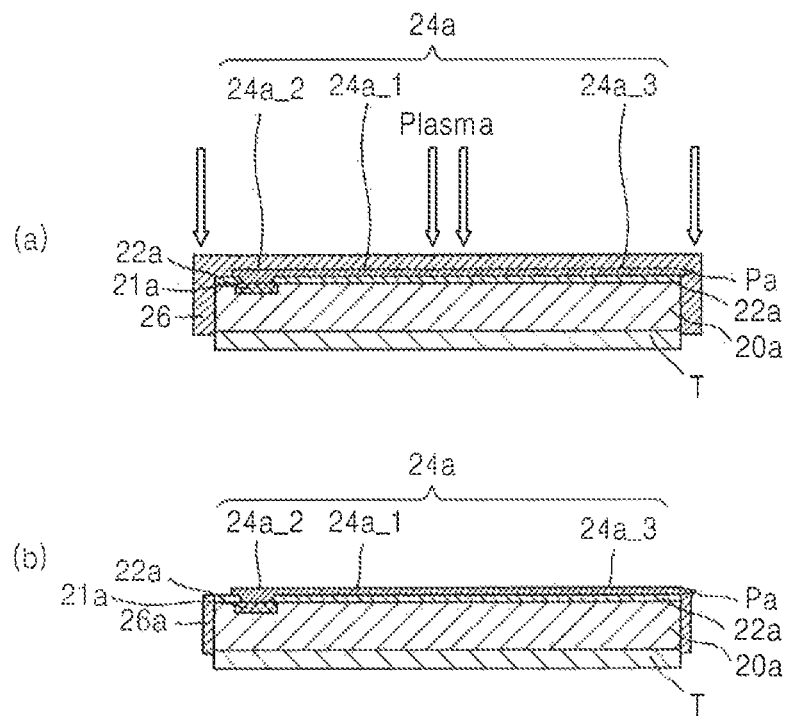

Referring to FIG. 4C, an insulating film 26 covering the upper surface and the side of the semiconductor chip 20a, as illustrated in FIG. 4C(a), for example, may be formed. The insulating film 26 may be formed by chemical vapor deposition (CVD), inkjetting, or spray coating, for example. The insulating film 26 may include a polymer, such as epoxy mold compound (EMC), parylene, or the like.

As illustrated in FIG. 4C(b), a portion of the insulating layer 26 covering the upper surface of the semiconductor chip 20a may be removed. The insulating layer 26 may be removed by plasma etching. The protective layer 22a and the redistribution layer 24a may be exposed and an insulating film 26a covering the side of the semiconductor chip 20a may remain.

Figure 4D:
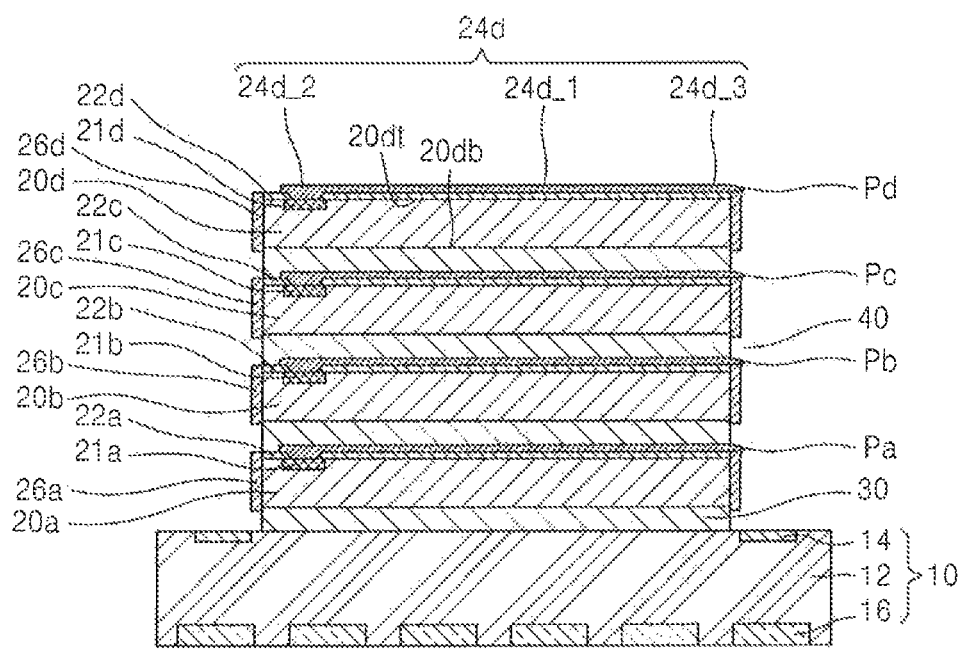

Referring to FIG. 4D, the semiconductor chips 20a, 20b, 20c, and 20d may be sequentially stacked on the body 12 of the package substrate 10 via the adhesive member 30. The semiconductor chips 20a, 20b, 20c, and 20d may be sequentially stacked so that their respective protruding portions Pa, Pb, Pc, and Pd face toward an edge of the package substrate 10.

The body 12 of the package substrate 10 may include, for example, silicon, glass, ceramic, or plastic. The body 12 may have a single layer structure or a multi layer structure including interconnection patterns therein. The body 12 may include at least one penetrating electrode. The substrate connection pads 14 and the lower pads 16 may include a conductive material.

The adhesive member 30 may be a film-type or a liquid-type adhesive member, and may be interposed between the semiconductor chip 20a and the package substrate 10 and between the semiconductor chips 20a, 20b, 20c, and 20d after removing the tape T (refer to FIGS. 4C(a) and 4C(b)) under each of the semiconductor chips 20a, 20b, 20c, and 20d.

Figure 4E:
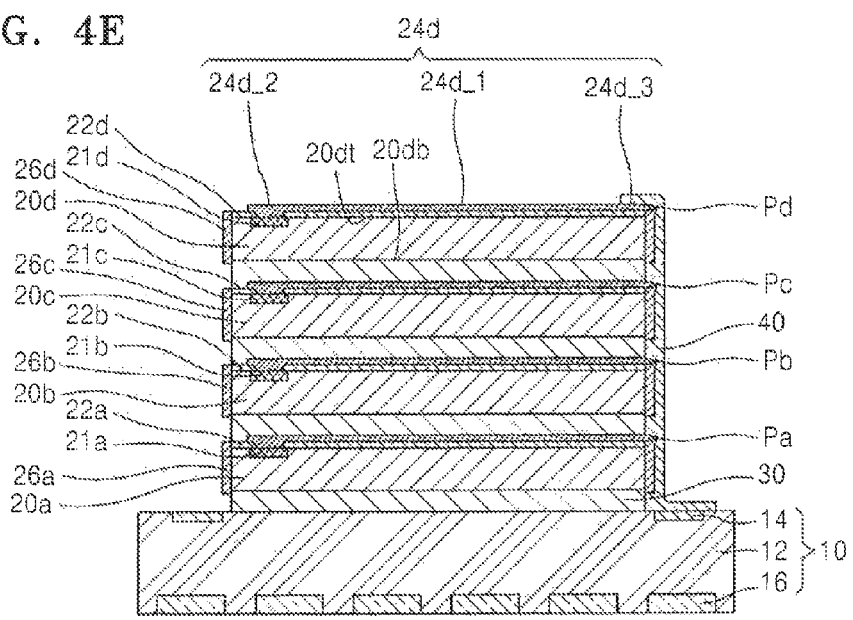

Referring to FIG. 4E, the interconnection line 40 having a line shape may be formed. The interconnection line 40 may cover at least a portion of the substrate connection pad 14 of the package substrate 10. The interconnection line 40 may extend along the sides of the semiconductor chips 20a, 20b, 20c, and 20d and may contact the protruding portions Pa, Pb, Pc, and Pd of the semiconductor chips 20a, 20b, 20c, and 20d. The interconnection line 40 may cover at least a portion of the expansion pad portion 24d_3 on the uppermost semiconductor chip 20d. The interconnection line 40 may be formed by inkjetting, dipping, plating or the like. The interconnection line 40 may include a conductive material, such as Au, Ag, Cu, solder, or the like.

Figure 4F:
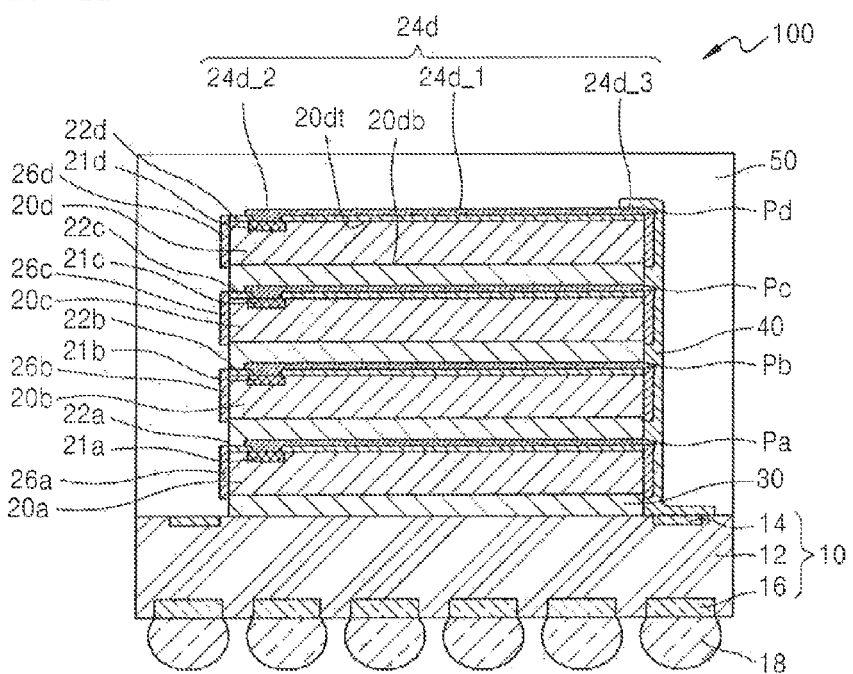

Referring to FIG. 4F, the encapsulating member 50 that covers the upper surface of the package substrate 10 and seals the stacked semiconductor chips 20a, 20b, 20c, and 20d may be formed. The encapsulating member 50 may include an EMC, for example.

The connecting members 18 may be formed on the lower pads 16 of the lower surface of the package substrate 10. The connecting members 18 may include at least one conductive material, e.g., Cu, Al, Ag, Tin, Au, and/or solder. In exemplary embodiments of the present inventive concept, the connecting members 18 are not limited to the shape of a ball, and may have any one of various shape, such as, for example, a cylinder, a polygonal pillar, a polyhedron, and the like.

The semiconductor package 100 may be formed by singulating the package substrate by a predetermined unit. A plurality of the semiconductor chips 20a may be arranged on a relatively wide proto-type package substrate and semiconductor chips 20b, 20c, and 20d may be respectively stacked on the semiconductor chips 20a. The encapsulating member 50 may seal a plurality of stack structures of the semiconductor chips 20a, 20c, and 20d on the proto-type package substrate, and the resultant structure may be formed into individual semiconductor packages, thereby manufacturing a plurality of semiconductor packages 100 at a time.

Figure 5:
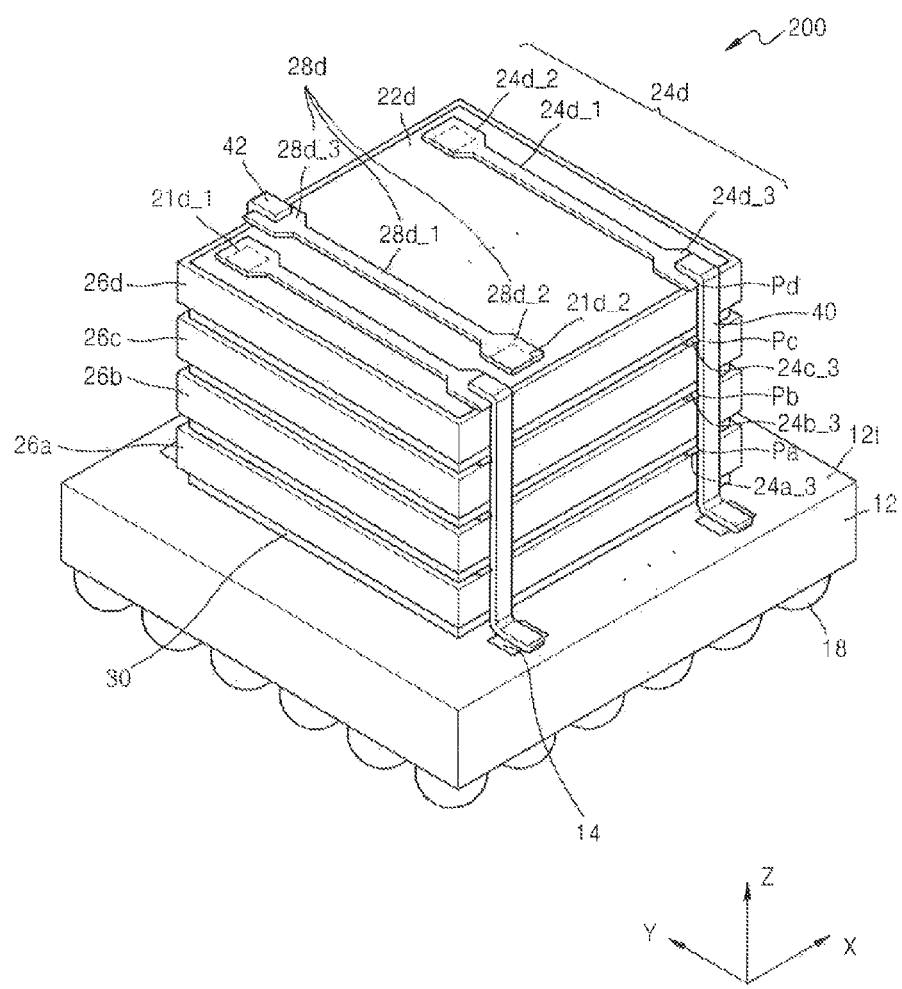
FIG. 5 is a perspective view illustrating a structure of a semiconductor package according to an exemplary embodiment of the present inventive concept.

FIG. 5 is a perspective view illustrating a structure of a semiconductor package 200 according to an exemplary embodiment of the present inventive concept. Repeated descriptions of a configuration of FIG. 5 that are the same as or similar to the configurations illustrated in FIGS. 1 and 2 may be omitted, and differences between the configuration illustrated in FIG. 5 and the configurations illustrated in FIGS. 1 and 2 may be described.

Semiconductor chips 20a, 20b, 20c, and 20d may be the same type or different types of semiconductor chips. The semiconductor chips 20a, 20b, 20c, and 20d may have the same structure as each other and may be sequentially stacked on a body 12 of a package substrate 10 via an adhesive member 30. Below, for convenience of explanation, a structure of the uppermost semiconductor chip 20d is described in more detail. Some reference numerals of redistribution layers of the semiconductor chips 20a, 20b, and 20c might not be illustrated in FIG. 5. Some reference numerals of redistribution layers of the semiconductor chips 20a, 20b, and 20c may correspond to those of redistribution layers of the semiconductor chip 20d.

In the semiconductor chip 20d of the semiconductor package 200 of FIG. 5, chip connection pads 21d_1 and 21d_2 may be formed respectively around two edges of the semiconductor chip 20d which may be opposite to each other. In the semiconductor package 200, the chip connection pads 21d_1 may be disposed adjacent to an edge of the semiconductor chip 20d in the positive Y direction and the chip connection pads 21d_2 may be disposed adjacent to an edge of the semiconductor chip 20d in the negative Y direction.

A protective layer 22d may be formed on the upper surface 20dt of the semiconductor chip 20d, and at least a portion of each of the chip connection pads 21d_1 and 21d_2 may be exposed by the protective layer 22d.

A plurality of redistribution layers 24d may be formed on the protective layer 22d. The plurality of redistribution layers 24d may cover at least a portion of each of the chip connection pads 21d_1 and extend to the edge of the semiconductor chip 20d in the negative Y direction. A plurality of redistribution layers 28d may be formed on the protective layer 22d. The plurality of redistribution layers 28d may cover at least a portion of each of the chip connection pads 21d_2 and extend to the edge of the semiconductor chip 20d in the positive Y direction. The redistribution layers 24d and the redistribution layers 28d may extend in opposite directions and may be exposed around corresponding edges of the semiconductor chip 20d. The plurality of redistribution layers 24d may be disposed in parallel to the plurality of redistribution layers 28d at a constant pitch. However, the present inventive concept is not limited thereto, and the plurality of redistribution layers 24d may be disposed in parallel to the plurality of redistribution layers 28d at various pitches.

Like the redistribution layers 24d, each of the redistribution layers 28d may include an extension portion 28d_1, a connection portion 28d2, and an expansion pad portion 28d_3. Like in the redistribution layers 24d, a protruding portion may be formed in the expansion pad portion 28d_3 of each of the redistribution layers 28d.

A side 20ds of the semiconductor chip 20d may be covered with an insulating film 26d. The insulating film 26d may cover a lower portion of each of the redistribution layers 24d and 28d. An upper portion of a protruding portion Pd of each redistribution layer 24d and 28d may be exposed.

Like the semiconductor chip 20d, the semiconductor chips 20a, 20b, and 20c may have a structure in which their respective upper surfaces are covered respectively by protective layers 22a, 22b, and 22c, their respective sides are covered respectively by insulating films 26a, 26b, and 26c, and redistribution layers 24a, 24b, and 24c each extending to an edge of a corresponding semiconductor chip in the negative Y direction and redistribution layers 28a, 28b, and 28c each extending to an edge of a corresponding semiconductor chip in the positive Y direction are formed respectively on the protective layers 22a, 22b, and 22c.

The semiconductor chips 20a, 20b, 20c, and 20d may be sequentially stacked so that protruding portions Pa, Pb, Pc, and Pd of the redistribution layers 24a, 24b, 24c, and 24d face toward an edge of the package substrate 10 in the negative Y direction and protruding portions of the redistribution layers 28a, 28b, 28c, and 28d face toward an edge of the package substrate 10 in the positive Y direction.

A plurality of interconnection lines 40 may be formed at sides of the semiconductor chips 20a, 20b, 20c, and 20d in the negative Y direction, and a plurality of interconnection lines 42 may be formed at sides of the semiconductor chips 20a, 20b, 20c, and 20d in the positive Y direction. The plurality of interconnection lines 40 may extend in the Z direction and contact the protruding portions Pa, Pb, Pc, and Pd of the redistribution layers 24a, 24b, 24c, and 24d, and the plurality of interconnection lines 42 may extend in the Z direction and contact the protruding portions of the redistribution layers 28a, 28b, 28c, and 28d.

The plurality of interconnection lines 40 may each cover at least a portion of a corresponding one of substrate connection pads 14 in the package substrate 10. The plurality of interconnection lines 40 may each partially cover the insulating films 26a, 26b, 26c, and 26d on the sides of the semiconductor chips 20a, 20b, 20c, and 20d. The plurality of interconnection lines 40 may each contact a corresponding one of the protruding portions Pa, Pb, Pc, and Pd, and cover at least a portion of a corresponding expansion pad portion 24d_3 of the redistribution layers 24d formed on the upper surface 20dt of the uppermost semiconductor chip, e.g., the semiconductor chip 20d.

Like the plurality of interconnection lines 40, the plurality of interconnection lines 42 may each cover at least a portion of a corresponding one of substrate connection pads 14 in the package substrate 10. The plurality of interconnection lines 42 may each partially cover the insulating films 26a, 26b, 26c, and 26d on the sides of the semiconductor chips 20a, 20b, 20c, and 20d. The plurality of interconnection lines 42 may each contact corresponding protruding portions, and cover at least a portion of a corresponding expansion pad portion 28d_3 of the redistribution layers 28d formed on the upper surface 20dt of the uppermost semiconductor chip, e.g., the semiconductor chip 20d.

The semiconductor package 200 might not use wires and penetrating electrodes and may use the redistribution layers 24d and 28d and the interconnection lines 40 and 42 to electrically connect the semiconductor chips 20a, 20b, 20c, and 20d to each other and/or to electrically connect the semiconductor chips 20a, 20b, 20c, and 20d to the package substrate 10. The semiconductor package 200 may be light in weight and small in size and may increase wiring freedom, and may reduce a manufacturing cost thereof and increase the productivity thereof.

Figure 6:
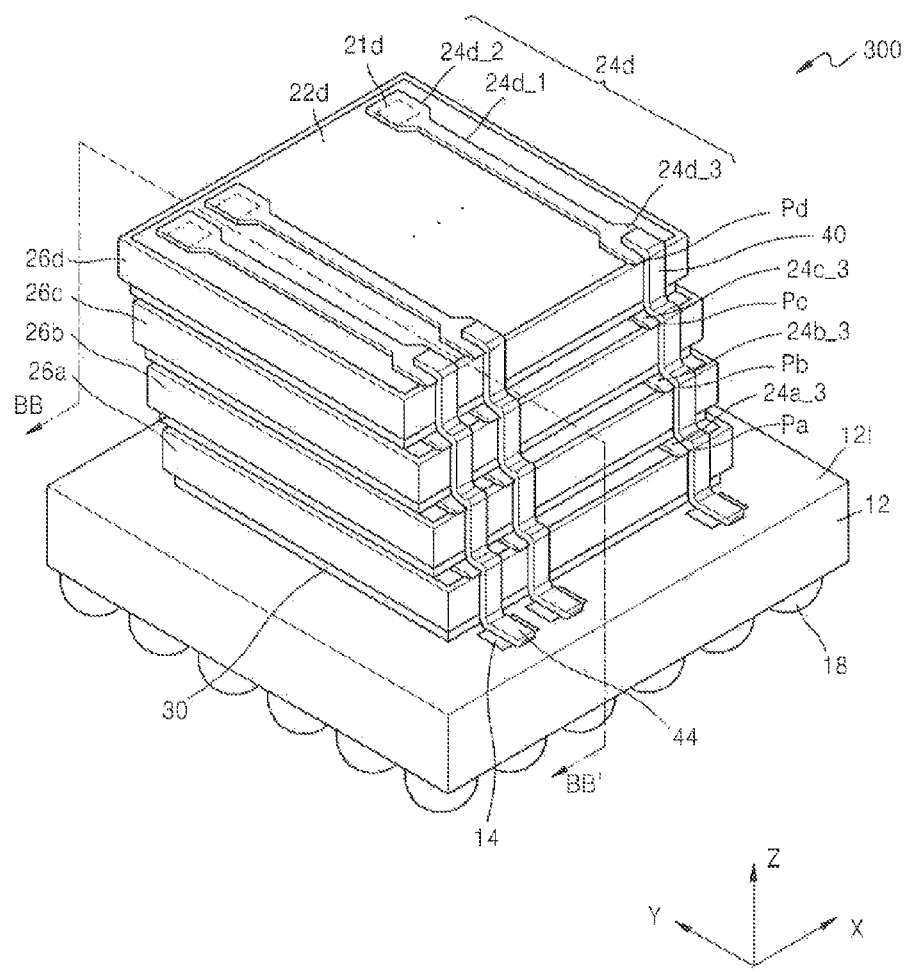
FIG. 6 is a perspective view illustrating a structure of a semiconductor package according to an exemplary embodiment of the present inventive concept.
Figure 7:
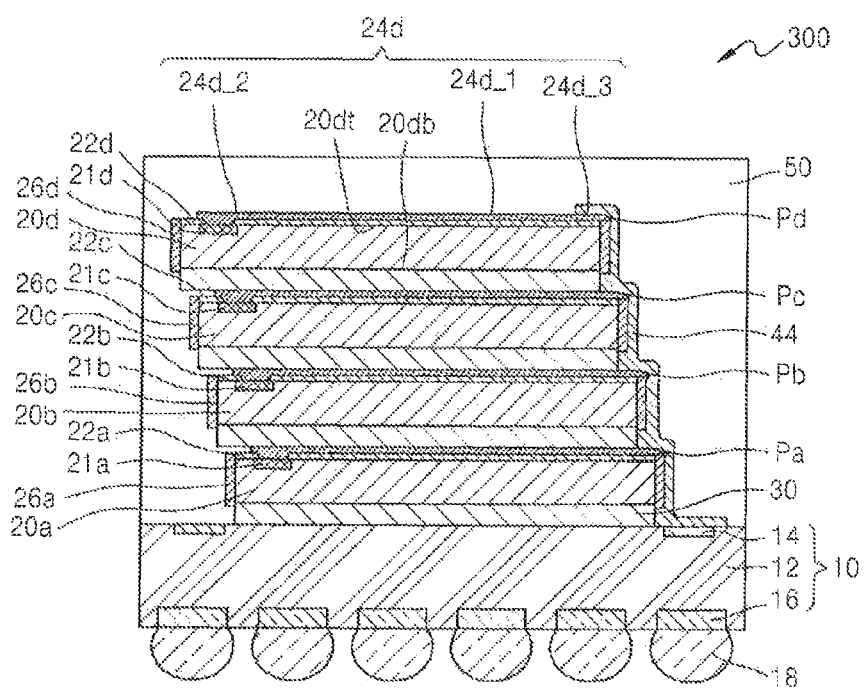
FIG. 7 is a cross-sectional view illustrating a cross section taken along the line BB-BB' of FIG. 6.

FIG. 6 is a perspective view illustrating a structure of a semiconductor package 300 according to an exemplary embodiment of the present inventive concept, and FIG. 7 is a cross-sectional view illustrating a cross section taken along the line BB-BB' of FIG. 6. Repeated descriptions of configurations of FIGS. 6 and 7 that are the same as or similar to the configurations illustrated in FIGS. 1 and 2 may be omitted, and differences between the configurations illustrated in FIGS. 6 and 7 and the configurations illustrated in FIGS. 1 and 2 may be described.

In the semiconductor package 300, semiconductor chips 20a, 20b, 20c, and 20d may be sequentially stacked in the shape of stairs. The semiconductor chips 20a, 20b, 20c, and 20d may have a structure in which their respective upper surfaces are covered respectively by protective layers 22a, 22b, 22c, and 22d, their respective sides are covered respectively by insulating films 26a, 26b, 26c, and 26d, and redistribution layers 24a, 24b, 24c, and 24d extending respectively to edges of semiconductor chips 20a, 20b, 20c, and 20d in the negative Y direction are formed respectively on the protective layers 22a, 22b, 22c and 22d. The semiconductor chips 20a, 20b, 20c, and 20d may be sequentially stacked so that expansion pad portions 24a_3, 24b_3, and 24c_3 are exposed on the upper surfaces of the semiconductor chips 20a, 20b, and 20c.

A plurality of interconnection lines 44 may each cover at least a portion of a corresponding one of substrate connection pads 14 in a package substrate 10. A plurality of interconnection lines 44 may each partially cover the insulating films 26a, 26b, 26c, and 26d on the sides of the semiconductor chips 20a, 20b, 20c, and 20d. A plurality of interconnection lines 44 may each contact corresponding protruding portions Pa, Pb, Pc, and Pd and expansion pad portions 24a_3, 24b_3, 24c_3, and 24d_3, and cover at least a portion of a corresponding expansion pad portion 24d_3 of the redistribution layers 24d formed on the upper surface 20dt of the uppermost semiconductor chip, e.g., the semiconductor chip 20d.

The semiconductor package 300 might not use wires and penetrating electrodes and may use the redistribution layers 24d and the interconnection lines 44. The semiconductor package 300 may be light in weight and small in size and may increase wiring freedom, and may reduce a manufacturing cost thereof and increase the productivity thereof.

Figure 8:
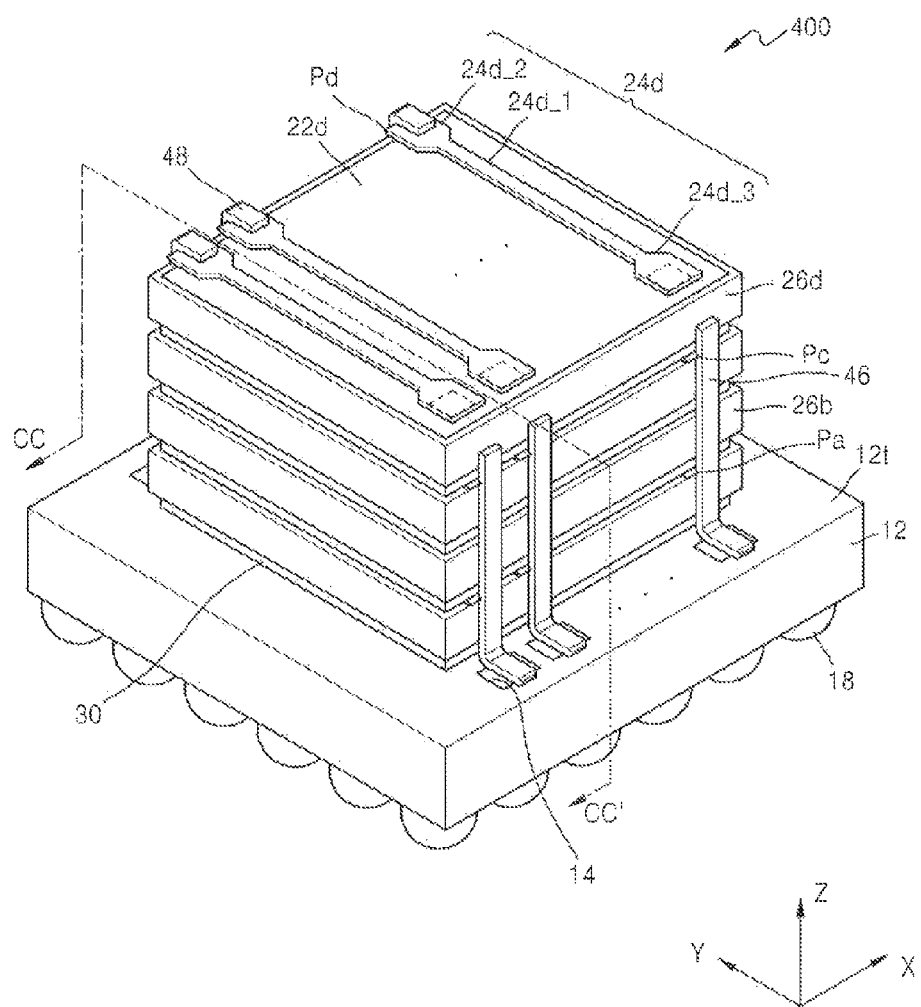
FIG. 8 is a perspective view illustrating a structure of a semiconductor package according to an exemplary embodiment of the present inventive concept.

FIG. 8 is a perspective view illustrating a structure of a semiconductor package 400 according to an exemplary embodiment of the present inventive concept, and FIG. 9 is a cross-sectional view illustrating a cross section taken along the line CC-CC' of FIG. 8. Repeated descriptions of configurations of FIGS. 8 and 9 that are the same as or similar to the configurations illustrated in FIGS. 1 and 2 may be omitted, and differences between the configurations illustrated in FIGS. 8 and 9 and the configurations illustrated in FIGS. 1 and 2 may be described.

In the semiconductor package 400, semiconductor chips 20a, 20b, 20c, and 20d may be divided into groups according to a direction in which their respective protruding portions face toward an edge of the package substrate 10, and semiconductor chips belonging to one group and semiconductor chips belonging to another group may be alternately stacked. The semiconductor chips 20a, 20b, 20c, and 20d may have a structure in which their respective upper surfaces are covered respectively by protective layers 22a, 22b, 22c, and 22d, their respective sides are covered respectively by insulating films 26a, 26b, 26c, and 26d, and redistribution layers 24a, 24b, 24c, and 24d are formed respectively on the protective layers 22a, 22b, and 22c. The semiconductor chips 20a and 20c, of which protruding portions may face toward an edge of the package substrate 10 in the negative Y direction, may be classified as a first semiconductor chip group. The semiconductor chips 20b and 20d, of which protruding portions may face toward an edge of the package substrate 10 in the positive Y direction, may be classified as a second semiconductor chip group. The semiconductor chips 20a and 20c of the first semiconductor chip group may be alternately stacked with the semiconductor chips 20b and 20d of the second semiconductor chip group.

A plurality of interconnection lines 46 may be formed at sides of the semiconductor chips 20a, 20b, 20c, and 20d in the negative Y direction, and a plurality of interconnection lines 48 may be formed at sides of the semiconductor chips 20a, 20b, 20c, and 20d in the positive Y direction. The plurality of interconnection lines 46 may extend in the Z direction and contact protruding portions Pa and Pc of the redistribution layers 24a and 24c, and the plurality of interconnection lines 48 may extend in the Z direction and contact protruding portions Pb and Pd of the redistribution layers 28b and 28d.

The plurality of interconnection lines 46 may cover at least portions of corresponding substrate connection pads 14 of the package substrate 10. The plurality of interconnection lines 46 may cover at least portions of the corresponding substrate connection pads 14 disposed around the edge of the package substrate 10 in the negative Y direction. The plurality of interconnection lines 46 may partially cover the insulating films 26a, 26b, and 26c on the sides of the semiconductor chips 20a, 20b, and 20c, and may contact corresponding protruding portions Pa and Pc.

The plurality of interconnection lines 48 may cover at least portions of corresponding substrate connection pads 14 of the package substrate 10. The plurality of interconnection lines 48 may cover at least portions of the corresponding substrate connection pads 14 disposed around the edge of the package substrate 10 in the positive Y direction. The plurality of interconnection lines 48 may partially cover the insulating films 26a, 26b, 26c, and 26d on the sides of the semiconductor chips 20a, 20b, 20c, and 20d. The plurality of interconnection lines 48 may contact corresponding protruding portions Pb and Pd, and may cover at least a portion of a corresponding expansion pad portion 28d_3 of the redistribution layers 28d formed on the upper surface 20dt of the uppermost semiconductor chip, e.g., the semiconductor chip 20d.

A group of the interconnection lines 46 and a group of the interconnection lines 48 may extend from the package substrate 10 to different heights in the Z direction.

The semiconductor package 400 might not use wires and penetrating electrodes and may use the redistribution layers 24d and the interconnection lines 46 and 48. The semiconductor package 400 may be light in weight and small in size and may increase wiring freedom, and may reduce a manufacturing cost thereof and increase the productivity thereof.

Figure 10:
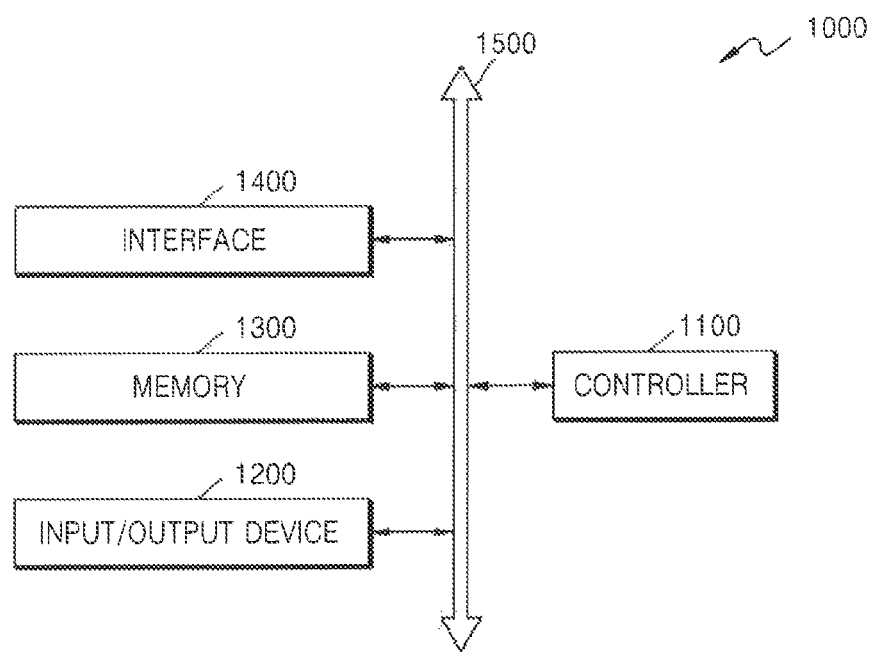
FIG. 10 is a schematic block diagram of a system including a semiconductor package, according to an exemplary embodiment of the present inventive concept.

FIG. 10 is a schematic block diagram of a system 1000 including a semiconductor package, according to an exemplary embodiment of the present inventive concept.

Referring to FIG. 10, the system 1000 may include a controller 1100, an input/output device 1200, a memory 1300, and an interface 1400. The system 1000 may be a mobile system, or a system for transmitting/receiving information, for example. In exemplary embodiments of the present invention, the mobile system may include a PDA, a portable computer, a web tablet, a wireless phone, a mobile phone, a digital music player, or a memory card.

The controller 1100 may control an execution program in the system, and may include a microprocessor, a digital signal processor, a microcontroller, or a device similar thereto. The input/output device 1200 may input or output data of the system 1000. The system 1000 may be connected to an external device, such as a personal computer or a network, by using the input/output device 1200 and may exchange data with the external device. The input/output device 1200 may include a keypad, a keyboard, or a display.

The memory 1300 may store code and/or data for an operation of the controller 1100. The memory 1300 may store data processed by the controller 1100. The memory device 1300 may include a semiconductor memory device including a semiconductor package technology according to an exemplary embodiment of the present inventive concept. For example, the memory device 1300 may be manufactured by using any of the semiconductor packages 100, 200, 300, and 400 shown in FIGS. 1, 5, 6, and 8.

The interface 1400 may be a data transmission path between the system 1000 and an external device. The controller 1100, the input/output device 1200, the memory 1300, and the interface 1400 may communicate with each other via a bus 1500. The system 1000 may be used for a mobile phone, an MP3 player, a navigation system, a portable multimedia player (PMP), a solid state disk (SSD), or household appliances, for example.

Figure 11:
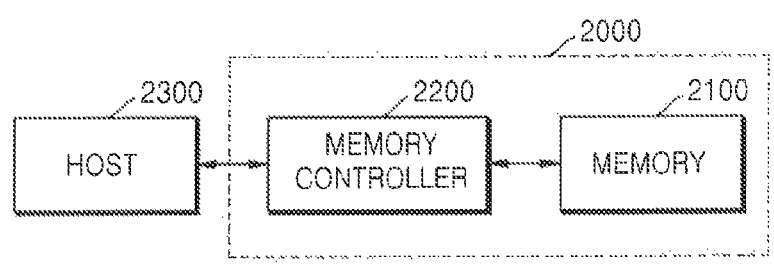
FIG. 11 is a block diagram of a memory card including a semiconductor package, according to an exemplary embodiment of the present inventive concept.

FIG. 11 is a block diagram of a memory card 2000 including a semiconductor package, according to an exemplary embodiment of the present inventive concept.

Referring to FIG. 11, the memory card 2000 may include a memory 2100 and a memory controller 2200.

The memory 2100 may store data. In exemplary embodiments of the present invention, the memory 2100 may have non-volatile characteristics such that the memory 2100 retains data even when no power is supplied. The memory 2100 may include a semiconductor memory device including a semiconductor package technology according to an exemplary embodiment of the present inventive concept. For example, the memory 2100 may be manufactured by using any of the semiconductor packages 100, 200, 300, and 400 shown in FIGS. 1, 5, 6, and 8.

The memory controller 2200 may read data stored in the memory 2100 or store data in the memory 2100 in response to a read/write request of a host 2300.

While the present inventive concept has been particularly shown and described with reference to exemplary embodiments thereof, it will be understood that various changes in form and detail may be made therein without departing from the spirit and scope of the present inventive concept.

What is claimed is:

1. A semiconductor package, comprising:
a package substrate comprising a substrate connection pad;
at least one semiconductor chip comprising at least one redistribution layer disposed on the package substrate, wherein the at least one redistribution layer covers at least a portion of a chip connection pad and extends along an upper surface of the at least one semiconductor chip in a first direction from the chip connection pad to an edge of the at least one semiconductor chip; and at least one interconnection line disposed on a side of the at least one semiconductor chip, wherein the at least one interconnection line electrically connects the substrate connection pad to the at least one redistribution layer, and wherein the at least one redistribution layer comprises a protruding portion protruding from the edge of the at least one semiconductor chip, wherein a first side of the protruding portion is covered by an insulating film and a second side of the protruding portion is not covered by the insulating film, and wherein the second side of the protruding portion not covered by the insulating film is in contact with the at least one interconnection line.

2. The semiconductor package of claim 1, wherein an area of a cross section of the protruding portion, which is perpendicular to the first direction, is changed along the first direction.

3. The semiconductor package of claim 1, wherein as the protruding portion protrudes farther away from the edge of the at least one semiconductor chip, a thickness of the protruding portion gradually decreases.

4. The semiconductor package of claim 1, wherein the protruding portion is disposed higher than the upper surface of the at least one semiconductor chip.

5. The semiconductor package of claim 1, wherein the insulating film covers a side of the at least one semiconductor chip.

6. The semiconductor package of claim 1, wherein the at least one semiconductor chip comprises a reforming area disposed on the edge of the at least one semiconductor chip.

7. The semiconductor package of claim 6, wherein the reforming area has a crystal orientation that is different from that of an area adjacent to the reforming area in the at least one semiconductor chip.

8. The semiconductor package of claim 1, further comprising a protective layer configured to cover the upper surface of the at least one semiconductor chip and configured to expose at least the portion of the chip connection pad.

9. The semiconductor package of claim 1, wherein the at least one redistribution layer includes two or more redistribution layers and the at least one interconnection line includes two or more interconnection lines, wherein the two or more redistribution layers comprise a first redistribution layer extending from a first chip connection pad to a first edge of the at least one semiconductor chip and a second redistribution layer extending from a second chip connection pad to a second edge of the at least one semiconductor chip which is different from the first edge, and the two or more interconnection lines comprise a first interconnection line which is electrically connected to the first redistribution layer, and a second interconnection line which is electrically connected to the second redistribution layer.

10. The semiconductor package of claim 1, wherein the at least one semiconductor chip includes two or more semiconductor chips, wherein the two or more semiconductor chips are sequentially stacked so that respective protruding portions of redistribution layers of the two or more semiconductor chips face toward a same edge of the package substrate.

11. The semiconductor package of claim 1, wherein the at least one semiconductor chip includes two or more semiconductor chips, wherein the two or more semiconductor chips are sequentially stacked in the shape of stairs and the respective protruding portions of redistribution layers of the two or more semiconductor chips face toward a same edge of the package substrate.

12. The semiconductor package of claim 1, wherein the at least one semiconductor chip includes two or more semiconductor chips, wherein the two or more semiconductor chips are grouped into a first semiconductor chip group, in which the protruding portion of one of the at least one redistribution layer faces toward a first edge of the package substrate, and a second semiconductor chip group, in which the protruding portion of another of the at least one redistribution layer faces toward a second edge of the package substrate, and semiconductor chips of the first semiconductor chip group are alternately stacked with semiconductor chips of the second semiconductor chip group.

13. The semiconductor package of claim 12, wherein the at least one interconnection line includes two or more interconnection lines, wherein the two or more interconnection lines comprise a first interconnection line which electrically connects the substrate connection pad to the semiconductor chips of the first semiconductor chip group, and a second interconnection line which electrically connects the substrate connection pad to the semiconductor chips of the second semiconductor chip group, and the first interconnection line and the second interconnection line extend up to different heights on the package substrate.

14. A semiconductor package, comprising:

a package substrate comprising a substrate connection pad;

at least one semiconductor chip disposed on the package substrate, wherein the at least one semiconductor chip comprises a protective layer covering an upper surface of the semiconductor chip and configured to expose a chip connection pad, an insulating film covering a side of the semiconductor chip, and at least one redistribution layer covering at least a portion of the chip connection pad and disposed along the protective layer in a first direction from the chip connection pad to an edge of the at least one semiconductor chip; and at least one interconnection line disposed along the insulating film, wherein the at least one interconnection line electrically connects the substrate connection pad to the at least one redistribution layer, wherein the at least one redistribution layer comprises a protruding portion protruding from the edge of the at least one semiconductor chip, wherein a first side of the protruding portion is covered by the insulating film and a second side of the protruding portion is not covered by the insulating film, and wherein the second side of the protruding portion not covered by the insulating film is in contact with the at least one interconnection line.

15. The semiconductor package of claim 14, wherein as the protruding portion protrudes farther away from the edge of the at least one semiconductor chip, a thickness of the protruding portion gradually decreases.

16. A semiconductor package, comprising:

a package substrate;

one or more substrate connection pads disposed on the package substrate;

a plurality of semiconductor chips stacked on the package substrate, wherein each of the plurality of semiconductor chips comprises one or more chip connection pads;

at least one redistribution layer disposed on a top surface of each of the plurality of semiconductor chips, wherein the at least one redistribution layer is electrically connected to the one or more chip connection pads;

one or more first protruding portions protruding from a first side of the plurality of semiconductor chips, wherein each of the first protruding portions is electrically connected to a redistribution layer, wherein a first side of each of the first protruding portions is covered by an insulating film and a second side of each of the first protruding portions is not covered by the insulating film, and wherein the second side of each of the first protruding portions not covered by the insulating film is in contact with one or more first interconnection lines; and one or more second protruding portions protruding from a second side of the plurality of semiconductor chips, wherein each of the second protruding portions is electrically connected to a redistribution layer, wherein a first side of each of the second protruding portions is covered by the insulating film and a second side of each of the second protruding portions is not covered by the insulating film, and wherein the second side of each of the second protruding portions not covered by the insulating film is in contact with one or more second interconnection lines, wherein the one or more first interconnection lines is disposed on the first side of the plurality of stacked semiconductor chips, and wherein each of the first interconnection lines is electrically connected to one or more of the substrate connection pads and one or more of the first protruding portions, wherein the one or more second interconnection lines is disposed on the second side of the plurality of stacked semiconductor chips, and wherein each of the interconnection lines is electrically connected one or more of the substrate connection pads and one or more of the second protruding portions.

17. The semiconductor package of claim 16, wherein the insulating film covers a side of the plurality of semiconductor chips.

18. The semiconductor package of claim 16, wherein each of the plurality of semiconductor chips comprises a reforming area disposed on an edge of the semiconductor chip.

19. The semiconductor package of claim 16, further comprising a protection layer disposed on the top surface of each of the plurality of semiconductor chips.

* * * * *